United States Patent
Hietala et al.

(10) Patent No.: US 8,866,549 B2
(45) Date of Patent: Oct. 21, 2014

(54) METHOD OF POWER AMPLIFIER CALIBRATION

(75) Inventors: Alexander Wayne Hietala, Phoenix, AZ (US); Timothy E. Daughters, Concord, MA (US)

(73) Assignee: RF Micro Devices, Inc., Greensboro, NC (US)

( * ) Notice: Subject to any disclaimer, the term of this patent is extended or adjusted under 35 U.S.C. 154(b) by 812 days.

(21) Appl. No.: 13/150,346

(22) Filed: Jun. 1, 2011

(65) Prior Publication Data

US 2011/0291857 A1 Dec. 1, 2011

Related U.S. Application Data

(60) Provisional application No. 61/350,325, filed on Jun. 1, 2010.

(51) Int. Cl.

| | |
|---|---|
| G01R 19/00 | (2006.01) |
| G01R 21/00 | (2006.01) |
| H03G 3/20 | (2006.01) |
| H04K 1/02 | (2006.01) |
| H04L 25/49 | (2006.01) |
| H04B 1/04 | (2006.01) |
| H03F 1/32 | (2006.01) |
| H03F 3/24 | (2006.01) |
| H03F 1/02 | (2006.01) |

(52) U.S. Cl.
CPC ............... *H03F 1/0222* (2013.01); *H03F 1/32* (2013.01); *H03F 3/24* (2013.01)
USPC ............... 330/129; 330/2; 330/127; 330/131; 375/297; 455/127.1

(58) Field of Classification Search
USPC ...................... 330/2, 127, 129, 131; 375/297; 455/127.1; 340/870.04
See application file for complete search history.

(56) References Cited

U.S. PATENT DOCUMENTS

| 4,996,500 A | 2/1991 | Larson et al. |
| 5,311,309 A | 5/1994 | Ersoz et al. |

(Continued)

FOREIGN PATENT DOCUMENTS

| EP | 0755121 A2 | 1/1997 |
| EP | 1569330 A1 | 8/2005 |

(Continued)

OTHER PUBLICATIONS

Li et al., "A highly efficient SiGe differential power amplifier using an envelope-tracking technique for 3GPP LTE applications," IEEE Bipolar/BiCMOS Circuits and Technology Meeting (BCTM), Oct. 4-6, 2010, pp. 121-124.

(Continued)

*Primary Examiner* — Daniel Wu
*Assistant Examiner* — Mohamed Barakat
(74) *Attorney, Agent, or Firm* — Withrow & Terranova, P.L.L.C.

(57) ABSTRACT

The exemplary embodiments include methods, computer readable media, and devices for calibrating a non-linear power detector of a radio frequency device based upon measurements of the non-linear power detector output and the associated power amplifier output level, and a set of data points that characterize a nominal non-linear power detector. The set of data points that characterize the nominal non-linear power detector is stored in a calibration system memory as nominal power detector output data. The measured non-linear power detector outputs, power amplifier output levels, and the nominal power detector output data is used to determine a power detector error function that characterizes the difference between the response of the non-linear power detector and the nominal non-linear power detector. The power detector error function and the nominal power detector output data are used to develop a calibrated power detector output data set that is stored in the non-linear power detector.

29 Claims, 9 Drawing Sheets

(56) References Cited

U.S. PATENT DOCUMENTS

| | | | |
|---|---|---|---|
| 5,351,087 A | 9/1994 | Christopher et al. | |
| 5,414,614 A | 5/1995 | Fette et al. | |
| 5,420,643 A | 5/1995 | Romesburg et al. | |
| 5,486,871 A | 1/1996 | Filliman et al. | |
| 5,581,454 A | 12/1996 | Collins | |
| 5,646,621 A | 7/1997 | Cabler et al. | |
| 5,715,526 A | 2/1998 | Weaver, Jr. et al. | |
| 5,748,037 A * | 5/1998 | Rozental et al. | 330/2 |
| 5,822,318 A | 10/1998 | Tiedemann, Jr. et al. | |
| 5,898,342 A | 4/1999 | Bell | |
| 5,905,407 A | 5/1999 | Midya | |
| 5,955,917 A * | 9/1999 | Mandell et al. | 330/2 |
| 6,043,610 A | 3/2000 | Buell | |
| 6,043,707 A | 3/2000 | Budnik | |
| 6,055,168 A | 4/2000 | Kotowski et al. | |
| 6,070,181 A | 5/2000 | Yeh | |
| 6,198,645 B1 | 3/2001 | Kotowski et al. | |
| 6,204,731 B1 | 3/2001 | Jiang et al. | |
| 6,300,826 B1 | 10/2001 | Mathe et al. | |
| 6,304,140 B1 * | 10/2001 | Thron et al. | 330/149 |
| 6,559,689 B1 | 5/2003 | Clark | |
| 6,617,930 B2 | 9/2003 | Nitta | |
| 6,621,808 B1 | 9/2003 | Sadri | |
| 6,642,784 B2 * | 11/2003 | McMorrow | 330/129 |
| 6,658,445 B1 | 12/2003 | Gau et al. | |
| 6,690,652 B1 | 2/2004 | Sadri | |
| 6,728,163 B2 | 4/2004 | Gomm et al. | |
| 6,734,729 B1 * | 5/2004 | Andrys et al. | 330/129 |
| 6,819,938 B2 | 11/2004 | Sahota | |
| 7,058,373 B2 | 6/2006 | Grigore | |
| 7,411,316 B2 | 8/2008 | Pai | |
| 7,450,916 B1 * | 11/2008 | Hietala et al. | 455/127.2 |
| 7,528,807 B2 | 5/2009 | Kim et al. | |
| 7,529,523 B1 | 5/2009 | Young et al. | |
| 7,595,569 B2 | 9/2009 | Amerom et al. | |
| 7,609,114 B2 | 10/2009 | Hsieh et al. | |
| 7,615,979 B2 | 11/2009 | Caldwell | |
| 7,627,622 B2 | 12/2009 | Conrad et al. | |
| 7,646,108 B2 | 1/2010 | Paillet et al. | |
| 7,696,735 B2 | 4/2010 | Oraw et al. | |
| 7,773,691 B2 | 8/2010 | Khlat et al. | |
| 7,777,459 B2 | 8/2010 | Williams | |
| 7,830,981 B2 * | 11/2010 | Rofougaran | 375/297 |
| 7,907,010 B2 | 3/2011 | Wendt et al. | |
| 7,994,864 B2 | 8/2011 | Chen et al. | |
| 8,000,117 B2 | 8/2011 | Petricek | |
| 8,008,970 B1 | 8/2011 | Homol et al. | |
| 8,081,199 B2 | 12/2011 | Takata et al. | |
| 8,093,951 B1 | 1/2012 | Zhang et al. | |
| 8,164,388 B2 | 4/2012 | Iwamatsu | |
| 8,174,313 B2 | 5/2012 | Vice et al. | |
| 8,198,941 B2 | 6/2012 | Lesso | |
| 8,270,916 B2 * | 9/2012 | Pennec et al. | 455/127.1 |
| 8,294,514 B2 * | 10/2012 | Visser et al. | 330/2 |
| 2002/0071497 A1 | 6/2002 | Bengtsson et al. | |
| 2003/0017286 A1 | 1/2003 | Williams et al. | |
| 2003/0062950 A1 | 4/2003 | Hamada et al. | |
| 2003/0232622 A1 | 12/2003 | Seo et al. | |
| 2004/0047329 A1 | 3/2004 | Zheng | |
| 2004/0124913 A1 | 7/2004 | Midya et al. | |
| 2004/0219891 A1 | 11/2004 | Hadjichristos | |
| 2004/0266366 A1 | 12/2004 | Robinson et al. | |
| 2004/0267842 A1 | 12/2004 | Allred | |
| 2005/0008093 A1 | 1/2005 | Matsuura et al. | |
| 2005/0032499 A1 | 2/2005 | Cho | |
| 2005/0122171 A1 | 6/2005 | Miki et al. | |
| 2005/0156662 A1 | 7/2005 | Raghupathy et al. | |
| 2006/0128324 A1 | 6/2006 | Tan et al. | |
| 2007/0024360 A1 | 2/2007 | Markowski | |
| 2007/0183532 A1 | 8/2007 | Matero | |
| 2008/0081572 A1 | 4/2008 | Rofougaran | |
| 2008/0150619 A1 | 6/2008 | Lesso et al. | |
| 2008/0205095 A1 | 8/2008 | Pinon et al. | |
| 2008/0242246 A1 | 10/2008 | Minnis et al. | |
| 2009/0004981 A1 | 1/2009 | Eliezer et al. | |
| 2009/0097591 A1 | 4/2009 | Kim | |
| 2009/0167260 A1 | 7/2009 | Pauritsch et al. | |
| 2009/0289720 A1 | 11/2009 | Takinami et al. | |
| 2010/0017553 A1 | 1/2010 | Laurencin et al. | |
| 2010/0301947 A1 | 12/2010 | Fujioka et al. | |
| 2010/0308654 A1 | 12/2010 | Chen | |
| 2011/0084760 A1 | 4/2011 | Guo et al. | |
| 2011/0148375 A1 | 6/2011 | Tsuji | |
| 2011/0235827 A1 | 9/2011 | Lesso et al. | |
| 2012/0068767 A1 | 3/2012 | Henshaw et al. | |
| 2012/0133299 A1 | 5/2012 | Capodivacca et al. | |
| 2012/0139516 A1 | 6/2012 | Tsai et al. | |
| 2012/0170334 A1 | 7/2012 | Menegoli et al. | |
| 2012/0176196 A1 | 7/2012 | Khlat | |
| 2012/0236444 A1 | 9/2012 | Srivastava et al. | |

FOREIGN PATENT DOCUMENTS

| | | |
|---|---|---|
| EP | 2214304 A1 | 8/2010 |
| EP | 2244366 A1 | 10/2010 |
| WO | 2004002006 A1 | 12/2003 |
| WO | 2004082135 A2 | 9/2004 |
| WO | 2006073208 A1 | 7/2006 |

OTHER PUBLICATIONS

Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.

International Search Report for PCT/US2011/061007 mailed Aug. 16, 2012, 16 pages.

International Search Report for PCT/US2012/024124 mailed Aug. 24, 2012, 14 pages.

International Search Report for US PCT/US2012/036858 mailed Aug. 9, 2012, 7 pages.

International Search Report for US PCT/US2012/036858 mailed Aug. 10, 2012, 8 pages.

Hekkala, A. et al., "Adaptive time misalignment compensation in envelope tracking amplifiers," International Symposium on Spread Spectrum Techniques and Applications, Aug. 2008, pp. 761-765.

Invitation to Pay Additional Fees and Where Applicable Protest Fee for PCT/US2012/024124 mailed Jun. 1, 2012, 7 pages.

Dixon, N., "Standardization boosts momentum for Envelope tracking," Microwave Engineers, Europe, Apr. 20, 2011, 2 pages, http://www.mwee.com/en/standardisation-boosts-momentum-for-envelope-tracking.html?cmp_ids=71&news_ids=222901746.

Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.

Kim, N. et al, "Ripple feedback filter suitable for analog/digital mixed-mode audio amplifier for improved efficiency and stability," Power Electronics Specialists Conference, vol. 1, Jun. 23, 2002, pp. 45-49.

Kim et al., "High Efficiency and Wideband Envelope Tracking Power Amplifiers with Sweet Spot Tracking," 2010 IEEE Radio Frequency Integrated Circuits Symposium, May 23-25, 2010, pp. 255-258.

Knutson, P, et al., "An Optimal Approach to Digital Raster Mapper Design," 1991 IEEE International Conference on Consumer Electronics held Jun. 5-7, 1991, vol. 37, Issue 4, published Nov. 1991, pp. 746-752.

Le, Hanh-Phuc et al., "A 32nm Fully Integrated Reconfigurable Switched-Capacitor DC-DC Convertor Delivering 0.55W/mm^2 at 81% Efficiency," 2010 IEEE International Solid State Circuits Conference, Feb. 20-24, 2010, pp 210-212.

Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.

Unknown, "Nujira files 100th envelope tracking patent," CS: Compound Semiconductor, Apr. 11, 2011, 1 page.

Non-final Office Action for U.S. Appl. No. 12/112,006 mailed Apr. 5, 2010, 6 pages.

(56) References Cited

OTHER PUBLICATIONS

Notice of Allowance for U.S. Appl. No. 12/112,006 mailed Jul. 19, 2010, 6 pages.
International Search Report for PCT/US11/033037 mailed Aug. 9, 2011, 10 pages.
International Search Report for PCT/US2011/044857 mailed Oct. 24, 2011, 10 pages.
International Search Report for PCT/US11/49243 mailed Dec. 22, 2011, 9 pages.
International Search Report for PCT/US2011/064255 mailed Apr. 3, 2012, 12 pages.
Non-final Office Action for U.S. Appl. No. 11/113,873, now Patent No. 7,773,691 mailed Feb. 1, 2008, 17 pages.
Final Office Action for U.S. Appl. No. 11/113,873, now Patent No. 7,773,691, mailed Jul. 30, 2008, 19 pages.
Non-final Office Action for U.S. Appl. No. 11/113,873, now Patent No. 7,773,691, mailed Nov. 26, 2008, 22 pages.
Final Office Action for U.S. Appl. No. 11/113,873, now Patent No. 7,773,691, mailed May 4, 2009, 20 pages.
Non-final Office Action for U.S. Appl. No. 11/113,873, now Patent No. 7,773,691, mailed Feb. 3, 2010, 21 pages.
Notice of Allowance for U.S. Appl. No. 11/113,873, now Patent No. 7,773,691, mailed Jun. 9, 2010, 7 pages.
International Search Report for PCT/US06/12619 mailed May 8, 2007, 2 pages.
Extended European Search Report for application 06740532.4 mailed Dec. 7, 2010, 7 pages.
International Search Report for PCT/US2011/061009 mailed Feb. 8, 2012, 14 pages.
International Search Report for PCT/US2012/023495 mailed May 7, 2012, 13 pages.
Invitation to Pay Additional Fees and Where Applicable Protest Fee for PCT/US2011/061007 mailed Feb. 13, 2012, 7 pages.
Non-final Office Action for U.S. Appl. No. 13/218,400 mailed Nov. 8, 2012, 7 pages.
Notice of Allowance for U.S. Appl. No. 13/316,229 mailed Nov. 14, 2012, 9 pages.
Non-final Office Action for U.S. Appl. No. 13/222,484 mailed Nov. 8, 2012, 9 pages.
Non-final Office Action for U.S. Appl. No. 13/089,917 mailed Nov. 23, 2012, 6 pages.
Non final Office Action for U.S. Appl. No. 13/222,453 mailed Dec. 6, 2012, 13 pages.
International Preliminary Report on Patentability for PCT/US2011/033037 mailed Oct. 23, 2012, 7 pages.
International Preliminary Report on Patentability for PCT/US11/49243 mailed Nov. 13, 2012, 33 pages.

* cited by examiner

METHOD OF POWER AMPLIFIER CALIBRATION

RELATED APPLICATIONS

This application claims the benefit of U.S. provisional patent application No. 61/350,325, filed Jun. 1, 2010, the disclosure of which is incorporated herein by reference in its entirety.

FIELD OF THE DISCLOSURE

The embodiments disclosed herein are related to calibration of radio frequency RF devices. In particular, the embodiments disclosed herein are related to calibration of RF devices having a non-linear power detector.

BACKGROUND

Traditionally, factory calibration of a radio frequency (RF) device having a linear power detector and an RF power amplifier requires measurements of the output power delivered by the RF power amplifier to a load, such as an antenna, and the power detector output voltage output. If the power detector is an idealized linear detector, the liner power detector may be characterized by measuring a first power detector output voltage at a first output power level and a second power detector output voltage at a second output power level. However, if the power detector is a non-linear power detector, a substantially higher number of measurements are typically required to characterize and calibrate the response of the non-linear power detector. As a result, the factory calibration of the RF device having a non-linear power detector may result in slower production rates or increased investment in calibration equipment.

Accordingly, there is a need to develop apparatuses and techniques to quickly characterize the non-linear response of a non-linear power detector of an RF device in order to calibrate the radio frequency power amplifier.

SUMMARY

Embodiments disclosed in the detailed description relate to apparatuses, computer readable media, and methods to quickly calibrate radio frequency devices that use a non-linear power detector to control the output power of a radio frequency power amplifier. As an example, one embodiment of a system for calibrating a non-linear power detector of a radio frequency device may use measurements of the non-linear power detector output and the associated RF power amplifier output level and a set of data points that characterizes a nominal non-linear power detector to calibrate the radio frequency device. The set of data points that characterizes the nominal non-linear power detector may be stored in a memory of a calibration system as nominal power detector output data. The measured non-linear power detector outputs, measured power amplifier output levels, and the nominal power detector output data may be used to determine a power detector error function that characterizes the difference between the response of the non-linear power detector and the nominal non-linear power detector. The power detector error function and the nominal power detector output data may be used to develop a calibrated power detector output data set. The calibrated power detector output data may be stored in the non-linear power detector in order to calibrate the non-linear power detector.

One embodiment of a method for calibrating an electronic device includes providing a nominal data set including a plurality of nominal response data points. The plurality of nominal response data points may include a plurality of nominal input levels and a corresponding plurality of nominal output levels that characterize a desired response curve for the electric device. The method may further include obtaining a plurality of measured response data points, wherein each of the measured response data points includes a measured input level and a measured output level that corresponds to the measured input level. The method may further include adjusting the nominal data set based on the measured response data points and the nominal data set to generate a calibrated data set. The method may further include storing the calibrated data set in the electronic device to calibrate the electronic device.

Another embodiment of a method for calibrating a radio frequency device having a non-linear power detector may include providing nominal power detector output data including nominal power detector outputs and nominal power amplifier outputs to a calibration system, where each of the nominal power detector outputs is associated with one of the nominal power amplifier outputs. To calibrate the radio frequency device, the calibration system may instruct the radio frequency device to generate power amplifier output levels. For each of the power amplifier output levels generated by the radio frequency device, the calibration system may obtain a power detector output of the non-linear power detector and a power amplifier output of the radio frequency device that corresponds to the power detector output of the radio frequency device. The calibration system associates, for each of the power amplifier output levels generated by the radio frequency device, each power detector output of the non-linear power detector to one of the nominal power detector outputs based upon the power amplifier output of the radio frequency device that corresponds to the power detector output of the non-linear power detector. The calibration system calculates, for each power detector output of the non-linear power detector associated with one of the nominal power detector outputs, a measured power detector output error of measured power detector output errors based upon a difference between the power detector output and the one of the nominal power detector outputs associated with the power detector output, wherein each measured power detector output error is associated with one of the nominal power amplifier outputs. The calibration system calculates, for each of the plurality of nominal power detector outputs that is unassociated with one of the plurality of measured power detector output errors, a calculated power detector output error of a plurality of calculated power detector output errors based upon the plurality of measured power detector output errors and the plurality of nominal power amplifier outputs associated with the measured power detector output errors; wherein each calculated measured power detector output error is associated with one of the nominal power amplifier outputs. The calibration system generates calibrated power detector output data based upon the nominal power detector output data, the calculated power detector output errors, and the measured power detector output errors. The calibration system stores the calibrated power detector output data in the radio frequency device to calibrate the radio frequency device.

Another embodiment of a method for calibrating a radio frequency output of a radio frequency device having a non-linear power detector includes providing calibration system nominal power detector output data for a non-linear power detector of the radio frequency device to be calibrated. The nominal power detector output data may include nominal power detector outputs and nominal power amplifier outputs. Each of the nominal power detector outputs is associated with one of the nominal power amplifier outputs. The calibration system instructs the radio frequency device to generate a power amplifier output levels. The calibration system obtains, for each power amplifier output level of the power amplifier output levels, a power detector output of the non-linear power detector and a power amplifier output of the radio frequency device that correspond to the power amplifier output level, wherein each power amplifier output of the radio frequency device is associated with the power amplifier output level. The calibration system associates, for each power amplifier output level, the power detector output of the non-linear power detector to one of the nominal power detector outputs of the nominal power detector output data based upon the power amplifier output of the radio frequency device that corresponds to the power detector output of the non-linear power detector. The calibration system calculates, for each power detector output of the non-linear power detector associated with one of the nominal power detector outputs, a power detector output error based upon a difference between the power detector output level and the one of the nominal power detector outputs associated with the power detector output, wherein each power detector output error is associated with the one of the nominal power amplifier outputs. The calibration system determines a power detector error function based upon the power detector output errors and the associated ones of the nominal power amplifier outputs. The calibration system generates, for each nominal power amplifier output provided by the nominal power detector output data, calibrated power detector output data based upon the nominal power detector output data and the power detector error function. The calibration system stores the calibrated power detector output data in the radio frequency device to calibrate the radio frequency device.

Another embodiment of a calibration system includes a tangible computer readable medium embodying a program for using nominal power detector output data including nominal power detector outputs and nominal power amplifier outputs, where each of the nominal power detector outputs is associated with one of the nominal power amplifier outputs to calibrate a radio frequency device. The tangible computer medium includes computer executable instructions to calibrate a radio frequency output of a radio frequency device, wherein the computer executable instructions to configure the calibration system to command the radio frequency device to generate power amplifier output levels. The instructions further configure the calibration system to obtain, for each of the power amplifier output levels generated by the radio frequency device, a power detector output of the non-linear power detector and a power amplifier output of the radio frequency device that correspond to the power detector output of the non-linear power detector. The instructions further configure the calibration system to associate, for each of the power amplifier output levels generated by the radio frequency device, the power detector output of the non-linear power detector to one of the nominal power detector outputs based upon the power amplifier output of the radio frequency device that corresponds to the power detector output of the non-linear power detector. The instructions further configure the calibration system to calculate, for each power detector output of the non-linear power detector associated with one of the nominal power detector outputs, a measured power detector output error based upon a difference between the power detector output and the one of the nominal power detector outputs associated with the power detector output; wherein each measured power detector output error is associated with one of the nominal power amplifier outputs. The instructions further configure the calibration system to calculate, for each of the nominal power detector outputs that is unassociated with one of the measured power detector output errors, a calculated power detector output error based upon the measured power detector output errors and the nominal power amplifier outputs associated with the measured power detector output errors, wherein each calculated measured power detector output error is associated with one of the nominal power amplifier outputs. The instructions further configure the calibration system to generate calibrated power detector output data based upon the nominal power detector output data, the calculated power detector output errors, and the measured power detector output errors. The instructions further configure the calibration system to store the calibrated power detector output data in the radio frequency device to calibrate the radio frequency device.

Another embodiment of a calibration system includes a tangible computer readable medium embodying a program for using nominal power detector output data including nominal power detector outputs and nominal power amplifier outputs, where each of the nominal power detector outputs is associated with one of the nominal power amplifier outputs to calibrate a radio frequency device. The tangible computer medium includes computer executable instructions to calibrate a radio frequency output of a radio frequency device, wherein the computer executable instructions configure the calibration system to instruct the radio frequency device to generate a power amplifier output levels. The instructions further configure the calibration system to obtain, for each power amplifier output level of the power amplifier output levels, a power detector output of the non-linear power detector and a power amplifier output of the radio frequency device that correspond to the power amplifier output level, wherein each power amplifier output of the radio frequency device is associated with the power amplifier output level. The instructions further configure the calibration system to associate, for each power amplifier output level, the power detector output of the non-linear power detector to one of the nominal power detector outputs of the nominal power detector output data based upon the power amplifier output of the radio frequency device that corresponds to the power detector output of the non-linear power detector. The instructions further configure the calibration system to calculate, for each power detector output of the non-linear power detector associated with one of the nominal power detector outputs, a power detector output error based upon a difference between the power detector output level and the one of the nominal power detector outputs associated with the power detector output, wherein each power detector output error is associated with the one of the nominal power amplifier outputs. The instructions further configure the calibration system to determine a power detector error function based upon the power detector output errors and the associated ones of the nominal power amplifier outputs. The instructions further configure the calibration system to generate, for each nominal power amplifier output provided by the nominal power detector output data, a calibrated power detector output data based upon the nominal power detector output data and the power detector error function. The instructions further configure the calibration system to store the calibrated power detector output data in the radio frequency device to calibrate the radio frequency device.

Another embodiment of a method for calibrating an electronic device having a feedback circuit may include providing nominal response curve data to a calibration system used to calibrate the electronic device. The nominal response curve data may include nominal feedback outputs and nominal device outputs, where each of the nominal feedback outputs is associated with one of the nominal device outputs. The calibration system may instruct the electronic device to generate device output levels. For each device output level of the device output levels, the calibration system may obtain a measured feedback output and a measured device output of the electronic device that correspond to the device output level, wherein each measured device output of the electronic device is associated with the device output level. The calibration system may associate, for each device output level, the measured feedback output of the feedback circuit to one of the nominal feedback outputs of the nominal response curve data based upon a correspondence between the measured device output of the electronic device and one of the nominal feedback outputs in the nominal response curve data. The calibration system may calibrate, for each measured feedback output, a feedback output error based upon a difference between the measured feedback output and the one of the nominal feedback outputs associated with the measured feedback output, wherein each feedback output error is associated with the one of the nominal device outputs. The calibration system may determine a feedback error function based upon the feedback output errors and the associated ones of the nominal device outputs. The calibration system may generate, for each nominal device output provided by the nominal response curve data, calibrated response curve data based upon the nominal response curve data and the feedback error function. The calibration system may store the calibrated response curve data in the electronic device to calibrate the electronic device.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Embodiments disclosed herein relate to apparatuses, computer readable media, and methods to quickly calibrate radio frequency devices that use a non-linear power detector to control the output power of a radio frequency power amplifier. As an example, one embodiment of a method for calibrating an electronic device includes providing a nominal data set including a plurality of nominal response data points. The plurality of nominal response data points may include a plurality of nominal input levels and a corresponding plurality of nominal output levels that characterize a desired response curve for the electric device. The method may further include obtaining a plurality of measured response data points, wherein each of the measured response data points includes a measured input level and a measured output level that corresponds to the measured input level. The method may further include adjusting the nominal data set based on the measured response data points and the nominal data set to generate a calibrated data set. The method may further include storing the calibrated data set in the electronic device to calibrate the electronic device. Another embodiment of a system for calibrating a non-linear power detector of a radio frequency device may use measurements of the non-linear power detector output and the associated RF power amplifier output level and a set of data points that characterizes a nominal non-linear power detector to calibrate the radio frequency device. The set of data points that characterizes the nominal non-linear power detector may be stored in a memory of a calibration system as nominal power detector output data. The measured non-linear power detector outputs, measured power amplifier output levels, and the nominal power detector output data may be used to determine a power detector error function that characterizes the difference between the response of the non-linear power detector and the nominal non-linear power detector. The power detector error function and the nominal power detector output data may be used to develop a calibrated power detector output data set. The calibrated power detector output data may be stored in the non-linear power detector in order to calibrate the non-linear power detector.

Figure 1A:
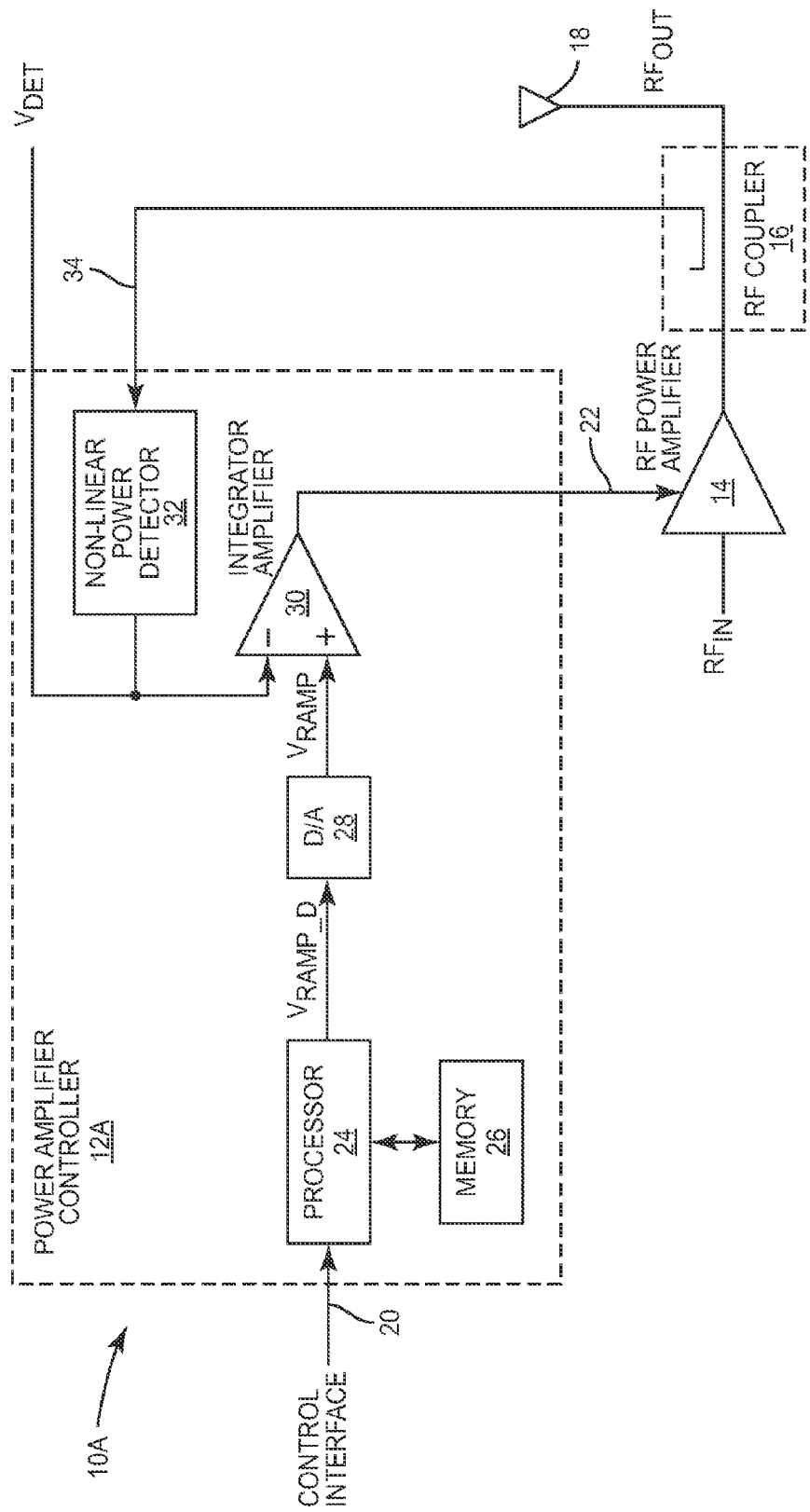
FIG. 1A depicts an example embodiment of an RF device having a power amplifier controller used to control the output power of an RF power amplifier.

FIG. 1A depicts an example embodiment of an RF device 10A having a power amplifier controller 12A used to control the output power of an RF power amplifier 14. The RF power amplifier is configured to receive an RF input signal, $RF_{IN}$, and provide an RF output signal, $RF_{OUT}$. The RF power amplifier 14 is coupled through an RF coupler 16 to an antenna 18. The coupler 16 senses the RF output signal, $RF_{OUT}$, and provides an input to the power amplifier controller 12A. The power amplifier controller 12A further includes a control interface 20, which may be used to control the operation of the power amplifier controller 12A. The power amplifier controller 12A may provide a power level control signal 22 to the RF power amplifier 14. The power level control signal 22 may be used to govern the output power level of the RF power amplifier 14. The output power level of the RF power amplifier 14 may be referred to as a power amplifier output level.

The power amplifier controller 12A includes a processor 24 coupled to a memory 26. The processor 24 may be in communication with the control interface 20 and configured to provide a digital $V_{RAMP}$ signal, $V_{RAMP\_D}$, to a digital-to-analog converter (D/A), 28. The processor 24 may control the output power level of the RF power amplifier 14 by setting the value of the digital $V_{RAMP}$ signal, $V_{RAMP\_D}$. The processor may include control logic, state machines, programmable logic devices, discrete gates or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices. As an example, a combination of computing devices may include a combination of a Digital Signal Processor (DSP) and a microprocessor, a plurality of microprocessors, one or more microprocessors in conjunction with a DSP core, or any other such configuration.

The memory 26 may include Random Access Memory (RAM), flash memory, Read Only Memory (ROM), Electrically Programmable ROM (EPROM), Electrically Erasable Programmable ROM (EEPROM), registers, and/or other types of memory as known in the art.

The digital-to-analog converter (D/A) 28 generates a $V_{RAMP}$ signal for controlling the power output level of the RF power amplifier 14. The $V_{RAMP}$ signal may represent a signal that contains the required supply modulation information for a power amplifier collector of the RF power amplifier 14, and is used to generate the power level control signal 22. During normal operation of the RF device 10A, the digital $V_{RAMP}$ signal, $V_{RAMP\_D}$, may be generated in order to set the RF output signal, $RF_{OUT}$, to a desired output power level during transmission of the RF input signal, $RF_{IN}$. During calibration, the digital $V_{RAMP}$ signal, $V_{RAMP\_D}$, may be set via the control interface 20 in order to instruct the RF power amplifier 14 to output a desired output power level into a load such as an antenna 18. The digital $V_{RAMP}$ signal, $V_{RAMP\_D}$, may be based upon a known RF modulation Amp(t)*cos(2*pi*$f_{RF}$*t+Phase(t)). The digital $V_{RAMP}$ signal, $V_{RAMP\_D}$, may represent a target supply voltage to be provided to the RF power amplifier 14.

The power amplifier controller 12A further includes an integrator amplifier 30 and a non-linear power detector 32. The integrator amplifier 30 may include a non-inverting input (+) and an inverting input (−). The integrator amplifier 30 may be configured to receive the $V_{RAMP}$ signal from the digital-to-analog converter 28 and a power detector output voltage, $V_{DET}$. The power detector output voltage, $V_{DET}$, represents the output power level of the RF power amplifier 14 as provided by the RF coupler 16 to the linear power detector 32. The integrator amplifier 30 may be configured to provide the power level control signal 22 to the RF power amplifier 14. The non-linear power detector 32 may be in communication with the coupler 16. The RF coupler 16 senses the RF output signal, $RF_{OUT}$, and provides a sensed $RF_{OUT}$ signal 34 to the non-linear power detector 32. Based upon the sensed $RF_{OUT}$ signal, the non-linear power detector 32 generates power detector output voltage, $V_{DET}$. The integrator amplifier 30 integrates the difference between the $V_{RAMP}$ signal and the power detector output voltage, $V_{DET}$, to generate the power level control signal 22. The integrator amplifier 30 may be configured to drive the difference between the $V_{RAMP}$ signal and the power detector output voltage, $V_{DET}$, to zero in order to set the desired output power level of the RF power amplifier 14.

In some embodiments of the RF device 10A, the power detector output voltage, $V_{DET}$, may be provided to an external pin of the RF device 10A for use during calibration. In other embodiments of the RF device 10A, the power detector output voltage, $V_{DET}$, is not provided to an external pin of the RF device 10A. In this case, during calibration of the RF device 10A, the value of the $V_{RAMP}$ signal may be used as a proxy for the power detector output voltage, $V_{DET}$, and it is assumed that the integrator amplifier 30 does not have a significant offset error between the non-inverting input of the integrator amplifier 30 and the inverting input of the integrator amplifier 30.

The memory 26 may be configured to store calibrated power detector output data. The calibrated power detector output data represents the response of the non-linear power detector 32 as determined during calibration of the RF device 10A. The calibrated power detector output data may include calibrated power detector outputs, $V_{DET\_CAL}$, and the power amplifier output levels associated with the calibrated power detector output, $V_{DET\_CAL}$. Each of the calibrated power detector outputs, $V_{DET\_CAL}$, represent a power detector output voltage, $V_{DET}$, that the non-linear power detector 32 generates for a particular power amplifier output power level sensed by the RF coupler 16. The processor 24 may use the calibrated detector output data to set the value of the digital $V_{RAMP}$ signal, $V_{RAMP\_D}$, during operation of the RF device 10A.

Figure 1B:
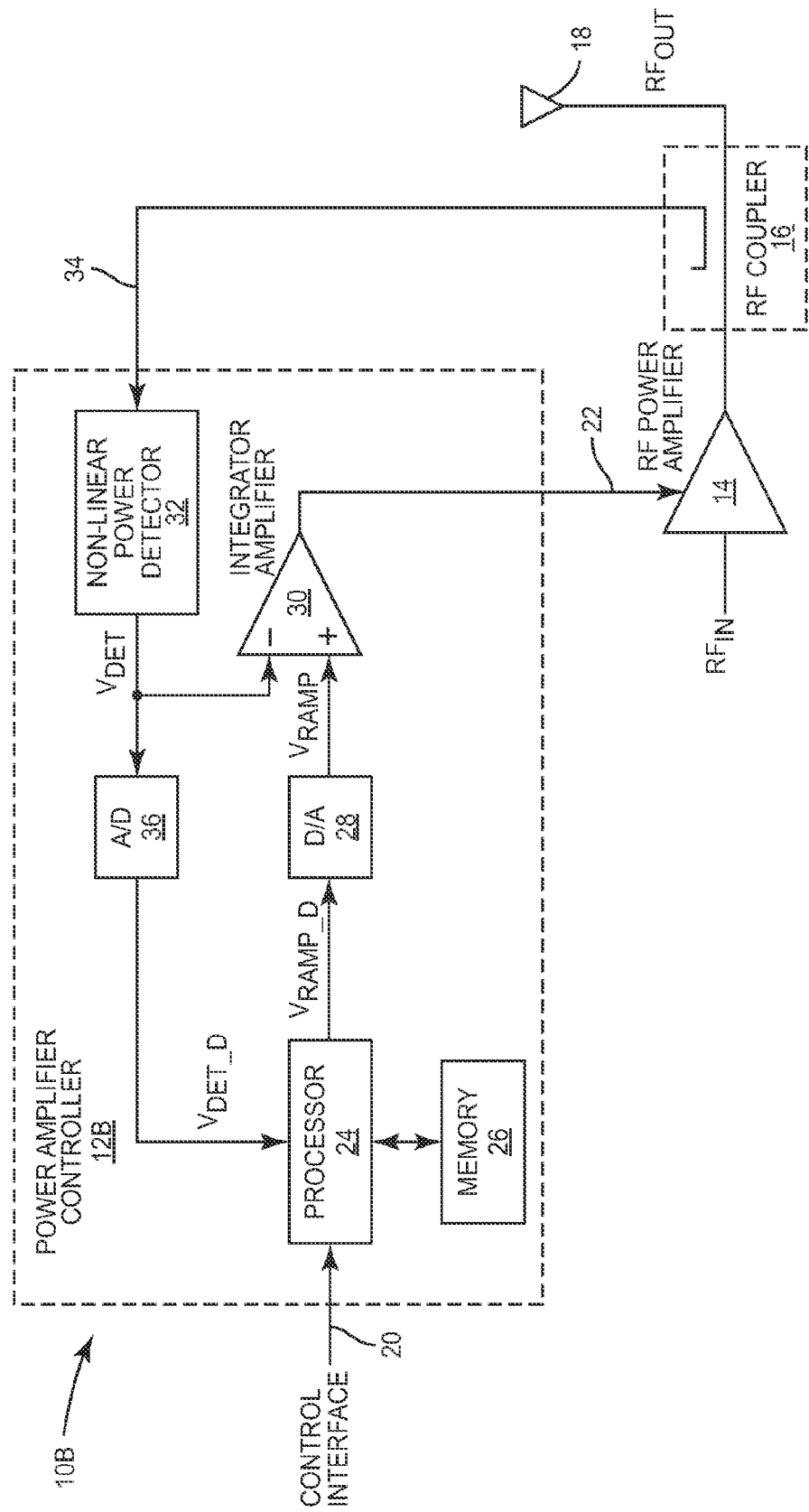
FIG. 1B depicts another example embodiment an RF device having a power amplifier controller used to control the output power of a RF power amplifier.

FIG. 1B depicts another example embodiment of an RF device 10B having a power amplifier controller 12B used to control the output power of an RF power amplifier 14. The power amplifier controller 12B is similar to the power amplifier controller 12A except that the power amplifier controller 12B may further include an analog-to-digital converter 36 configured to receive the power detector output voltage, $V_{DET}$. The analog-to-digital converter 34 digitizes the power detector output voltage, $V_{DET}$, to generate a digital power detector output voltage signal, $V_{DET\_D}$. The analog-to-digital converter 36 may be configured to provide the digital power detector output voltage signal, $V_{DET\_D}$, to the processor 24. During calibration of the RF device 10B, the value of the digital power detector output voltage signal, $V_{DET\_D}$, may be provided to an externally coupled device (not shown) via the control interface 20. Otherwise, operation of the power amplifier controller 12B is similar to the power amplifier controller 12A depicted in FIG. 1A.

Figure 1C:
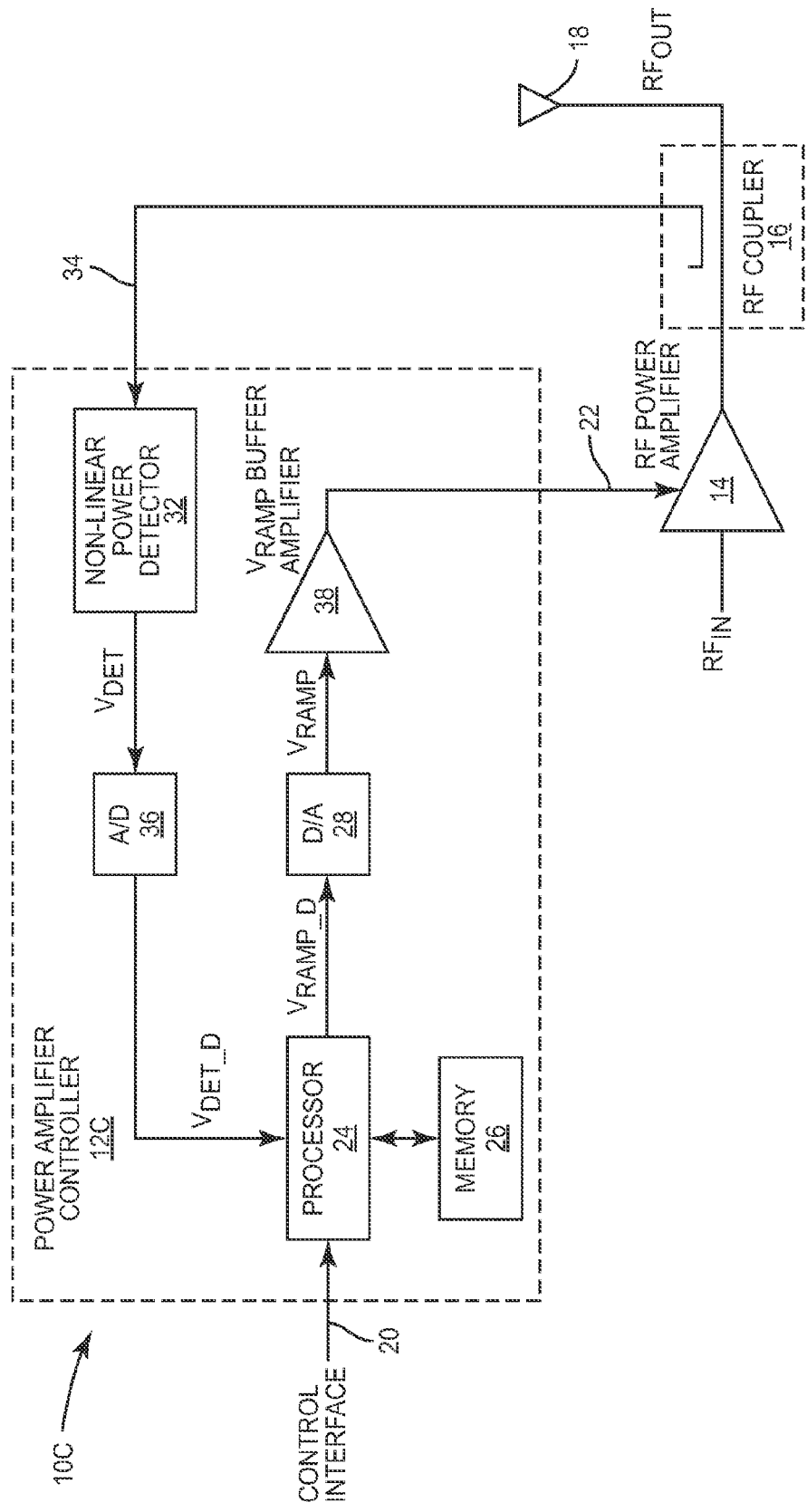
FIG. 1C depicts yet another example embodiment of an RF device having a power amplifier controller used to control the output power of a RF power amplifier.

FIG. 1C depicts yet another example embodiment of an RF device 10C having a power amplifier controller 12C used to control the output power of an RF power amplifier 14. The power amplifier controller 12C is similar to the power amplifier controller 12B, except the power amplifier controller 12C does not include the integrator amplifier 30, as depicted in FIG. 1B.

Instead, the power amplifier controller 12C includes a $V_{RAMP}$ buffer amplifier 38 configured to receive the $V_{RAMP}$ signal from the digital-to-analog converter 28. The $V_{RAMP}$ buffer amplifier 38 provides a power level control signal 22 to the RF power amplifier 14. The processor 24 uses the digital power detector output voltage signal, $V_{DET\_D}$, to determine a difference between the sensed $RF_{OUT}$ signal 34 and a desired output power level of the power amplifier 14. The processor 24 then changes the value of the digital power detector output voltage signal, $V_{DET\_D}$, to minimize the difference between the sensed $RF_{OUT}$ signal 34 and a desired output power level of the power amplifier 14.

Referring to FIGS. 1A, 1B, and 1C, in some example embodiments, the RF devices 10A, 10B, and 10C may be a mobile terminal. In other example embodiments, the RF devices 10A, 10B, and 10C, may be computing devices. In still other example embodiments, the RF devices 10A, 10B, and 10C, may be mobile telephones.

Figure 2A:
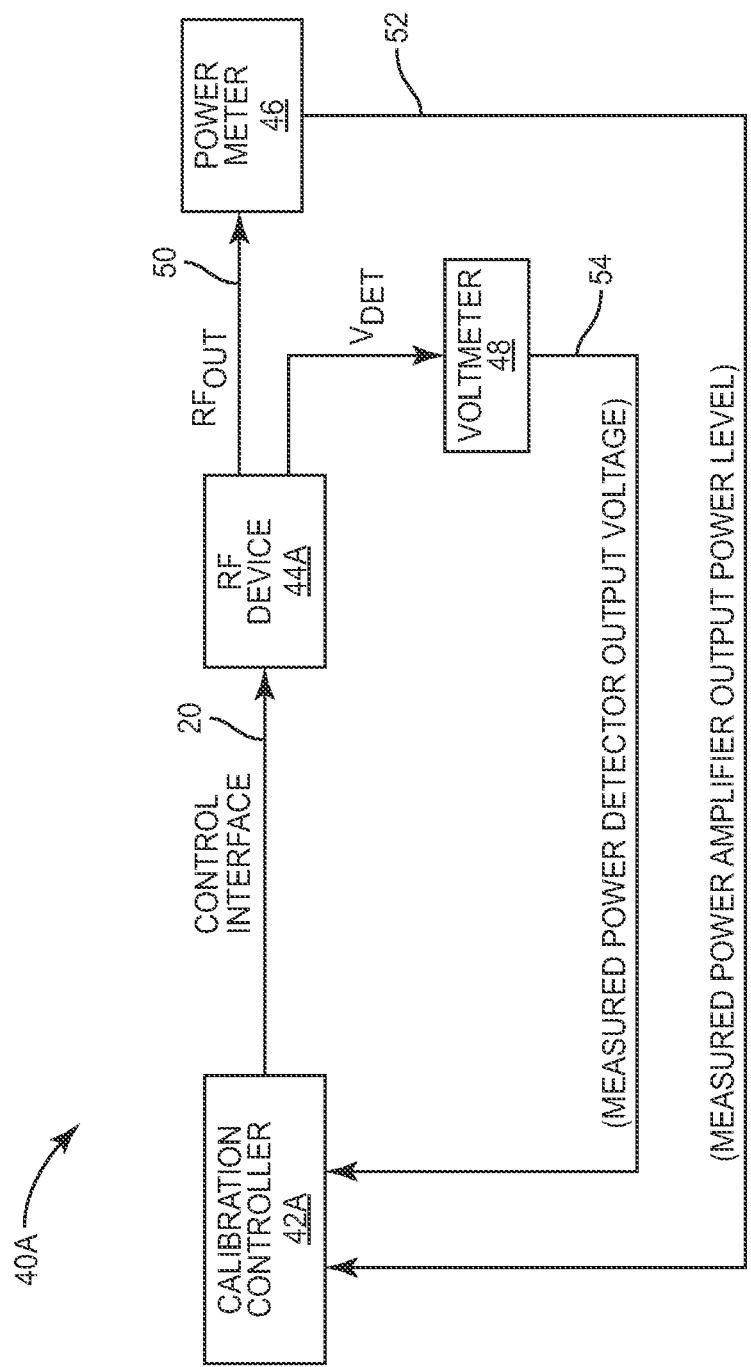
FIG. 2A depicts a first example embodiment of a calibration system for calibrating an RF device.

FIG. 2A depicts a first example embodiment of a calibration system 40A for calibrating an RF device 44A having a non-linear power detector. The calibration system 40A may include a calibration controller 42A, a power meter 46, and a voltmeter 48. The calibration system 40A may be configured to receive an RF device 44A to be calibrated and configured. As an example, the calibration system 40A may be installed in a factory and configured to calibrate RF devices during final assembly and inspection.

The calibration controller 42A may include a control interface 20 coupled to the RF device 44A. The RF device 44A may be similar to the RF device 10A of FIG. 1A, which provides the power detector output voltage, $V_{DET}$, at an external pin for use during calibration. The RF output signal, $RF_{OUT}$, of the RF device 44A is in communication with the power meter 46. In some embodiments of the calibration system 40A, the RF output signal, $RF_{OUT}$, of the RF device 44A is coupled to the power meter 46 via a controlled impedance line 50. The impedance of the controlled impedance line 50 and the input impedance of the power meter 46 may be configured to match the expected impedance of the antenna of the RF device 44A. As an example, the controlled impedance line 50 and the input impedance of the antenna of the RF device 44A may be configured to match a 50 ohm load. In this case, the antenna of the RF device 44A is either not yet installed or temporarily removed from the antenna port (not shown) of the RF device 44A. A controlled impedance line 50 is then attached to an antenna port (not shown) of the RF device 44A. The antenna port of the RF device 44A may be configured to receive the antenna. In other embodiments of the calibration system 40A, the RF device 44A is wirelessly coupled to the power meter 46. In this case, the power meter 46 includes an antenna (not shown) for receiving the RF output signal, $RF_{OUT}$, of the RF device 44A to be calibrated.

The power meter 46 may be configured to receive the RF output signal, $RF_{OUT}$. Based upon the received RF output signal, $RF_{OUT}$, the power meter 46 may be configured to provide a measured output power level, $P_{OUT}$, of the transmitted power of the RF output signal, $RF_{OUT}$, to the calibration controller 42A via a first communication interface 52. In some embodiments, the measured power amplifier output power level, $P_{OUT}$, may be provided to the calibration controller 42A in terms of power amplifier output voltage, $V_{OUT}$, which is the root-mean-square (RMS) voltage developed across the load that receives the RF output signal, $RF_{OUT}$. In some embodiments of the calibration controller 42A, the measured power amplifier output power level, $P_{OUT}$, is translated into terms of the power amplifier output voltage, $V_{OUT}$.

The voltmeter 48 may be configured to couple to the RF device 44A and receive the power detector output voltage, $V_{DET}$. The voltmeter 48 may be coupled to the calibration controller 42A via a second communication interface 54. The voltmeter 48 measures the received power detector output voltage, $V_{DET}$, and provides a measured value of the power detector output voltage, $V_{DET}$, to the calibration controller.

As will be described below, the calibration controller 42A may be configured to use the measured output power level, $P_{OUT}$, and the measured value of the power detector output voltage, $V_{DET}$ to calibrate the RF device 44A. The calibration controller 42A may include a computer or processor having memory. The computer or processor may include a Digital Signal Processor (DSP), an Application Specific Integrated Circuit (ASIC), a Field Programmable Gate Array (FPGA) or other programmable logic devices. The memory of the calibration controller 42A may be embodied in hardware and in instructions that are stored in memory, and may reside, for example, in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of computer readable medium known in the art. Instructions stored in the memory may include computer executable program code. An exemplary storage medium may be coupled to the processor such that a processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server. The calibration controller 42A may include hardware and/or instructions to execute or embody operational steps to be carried out by the calibration controller 42A. The operational steps to calibrate the RF device 44A may be performed in numerous different sequences. Furthermore, operations may actually be performed in a number of different steps.

Figure 3:
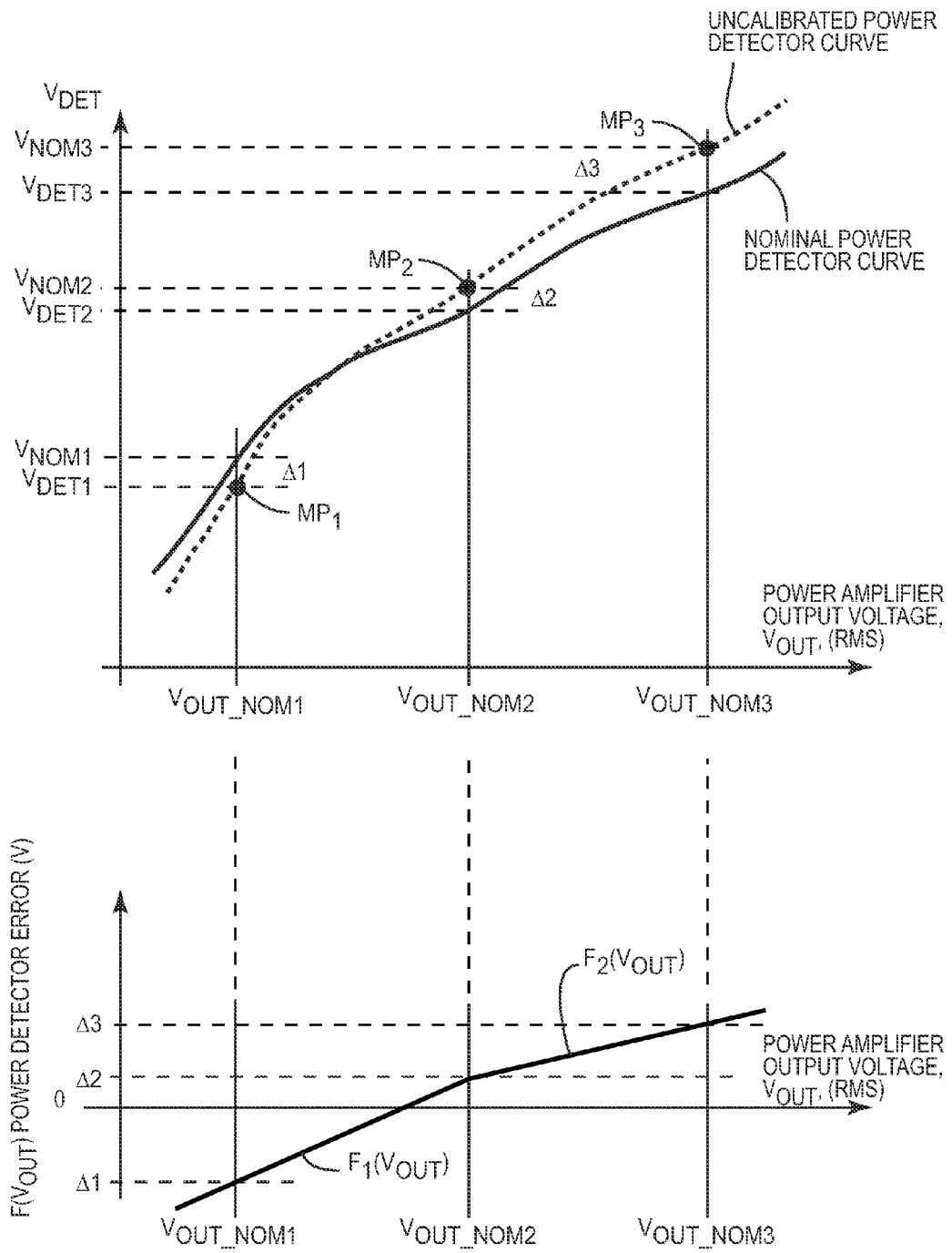
FIG. 3 depicts a relationship between a nominal power detector curve, an uncalibrated power detector curve and a power detector error function.

The memory of the calibration controller 42A may include nominal power detector output data. The nominal power detector output data represents the expected nominal input-output relationship of a nominal non-linear power detector of a nominal RF device 44A. FIG. 3 depicts a nominal power detector curve (solid line) that may be generated based upon the nominal power detector output data. The nominal power detector curve (solid line) may include a nominal power detector output voltage, $V_{NOM}(V_{OUT})$, of FIG. 3, for each output power level that the RF device 44A is expected to generate. As an example, the nominal power detector output data may include a nominal power detector output voltage, $V_{NOM}(V_{OUT})$, for each power level specified in the European Telecommunication Standard Institute (ETSI) standard for the RF device 44A to be calibrated. As a further example, the nominal power detector output data may include a nominal power detector output voltage, $V_{NOM}(V_{OUT})$, of FIG. 3, for each nominal power amplifier output level, $V_{OUT\_NOM}$, to be generated by the power amplifier of the RF device 44A. The relationship between the nominal power detector output voltage, $V_{NOM}(V_{OUT\_NOM})$, and the nominal power amplifier output levels, $V_{OUT\_NOM}$, provide the nominal power detector curve (solid line) and represent an expected performance of the non-lineal power detector of the RF device 44A. As an example, the first nominal power detector output voltage, $V_{NOM1}$, corresponds to a first nominal power amplifier output level, $V_{OUT\_NOM1}$. The second nominal power detector output voltage, $V_{NOM2}$, corresponds to a second nominal power amplifier output level, $V_{OUT\_NOM2}$. The third nominal power detector output voltage, $V_{NOM3}$, corresponds to a third nominal power amplifier output level, $V_{OUT\_NOM3}$.

Figure 2B:
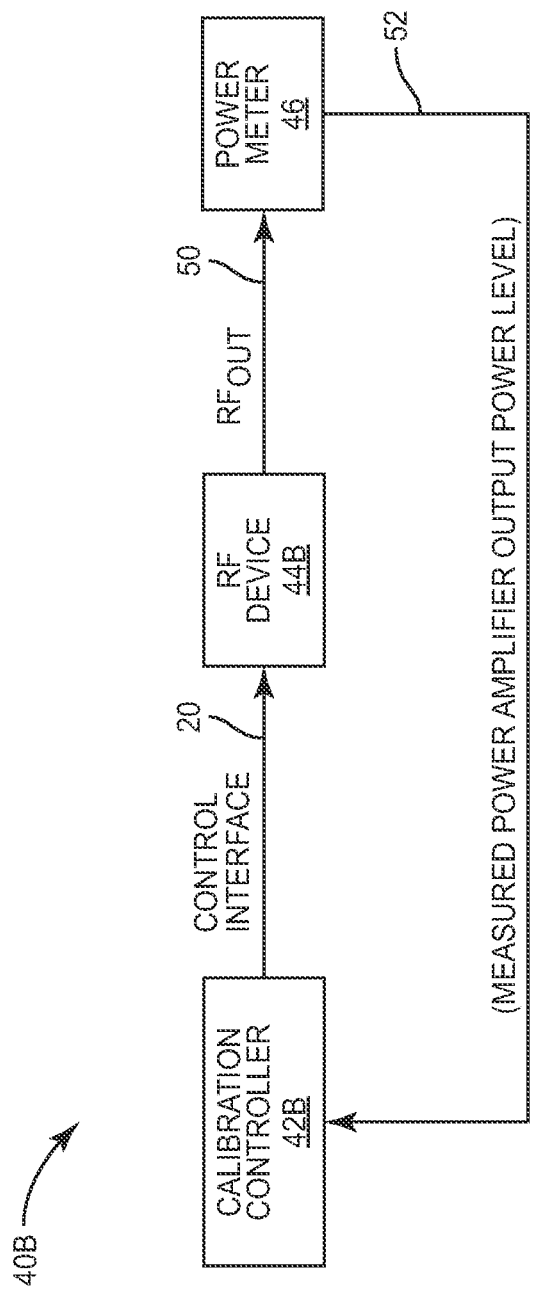
FIG. 2B depicts a second example embodiment of a calibration system for calibrating an RF device.

FIG. 2B depicts a second example embodiment of a calibration system 40B for calibrating an RF device 44B having a non-linear power detector. The calibration system 40B is similar to the calibration system 40A, of FIG. 2A, except that the calibration system 40B is configured to calibrate an RF device 44B that does not provide the power detector output voltage, $V_{DET}$, to an external pin that may be measured by a voltmeter. An example of the RF device 44B that does not provide the power detector output voltage, $V_{DET}$, to an external pin may include the RF device 10B of FIG. 1B or the RF device 10C of FIG. 1C. Instead, the calibration system 40B may be configured to read or receive the digital power detector output voltage signal, $V_{DET\_D}$, generated by the analog-to-digital converter 36. The calibration system 40B uses the value of the digital power detector output voltage signal, $V_{DET\_D}$, as the measured value of the power detector output voltage, $V_{DET}$.

Another example of an RF device 44B that does not provide the power detector output voltage, $V_{DET}$, to an external pin may include an embodiment of the RF device 44A of FIG. 2A that does not provide the power detector output voltage, $V_{DET}$, to an external pin. Instead, the calibration system 40B uses the value of the $V_{RAMP}$ signal as a proxy for the power detector output voltage, $V_{DET}$.

The calibration system 40B may include another embodiment of a calibration controller 42B. The calibration controller 42B is similar to the calibration controller 42A except there may not include a second communication interface 54 adapted to interface with a voltmeter. In addition, the calibration controller 42B may be configured to control the processor or access the memory of the RF device 44B that is to be calibrated. The calibration controller 42B may obtain the digital power detector output voltage signal, $V_{DET\_D}$, from either the processor 24 or memory 26 of the RF device 44B.

FIG. 3 further depicts a relationship between the nominal power detector curve (solid line), an uncalibrated power detector curve (dashed line), and a power detector error function. FIG. 3 will now be explained with continuing reference to the RF device 10A of FIG. 1A, the RF device 10B of FIG. 1B, or the RF device 10C of FIG. 1C. The uncalibrated power detector curve (dashed line) represents the input-output relationship of the non-linear power detector 32 of the RF device 10A, 10B, 10C, to be calibrated. FIG. 3 further includes a first measurement point, $MP_1$, a second measurement point, $MP_2$, and a third measurement point, $MP_3$. The first measurement point, $MP_1$, may represent the power detector output voltage, $V_{DET1}$, generated by the non-linear power detector 32 when the power amplifier 14 of the RF device 10A, 10B, 10C, generates a first power amplifier output power level, $V_{OUT1}$. The second measurement point, $MP_2$, may represent the power detector output voltage, $V_{DET2}$, generated by the non-linear power detector 32 when the power amplifier 14 of the RF device 10A, 10B, 10C, generates a second power amplifier output power level, $V_{OUT2}$. The third measurement point, $MP_3$, may represent the power detector output voltage, $V_{DET3}$, generated by the non-linear power detector 32 when the power amplifier 14 of the RF device 10A, 10B, 10C, generates a third power amplifier output power level, $V_{OUT3}$.

Figure 4:
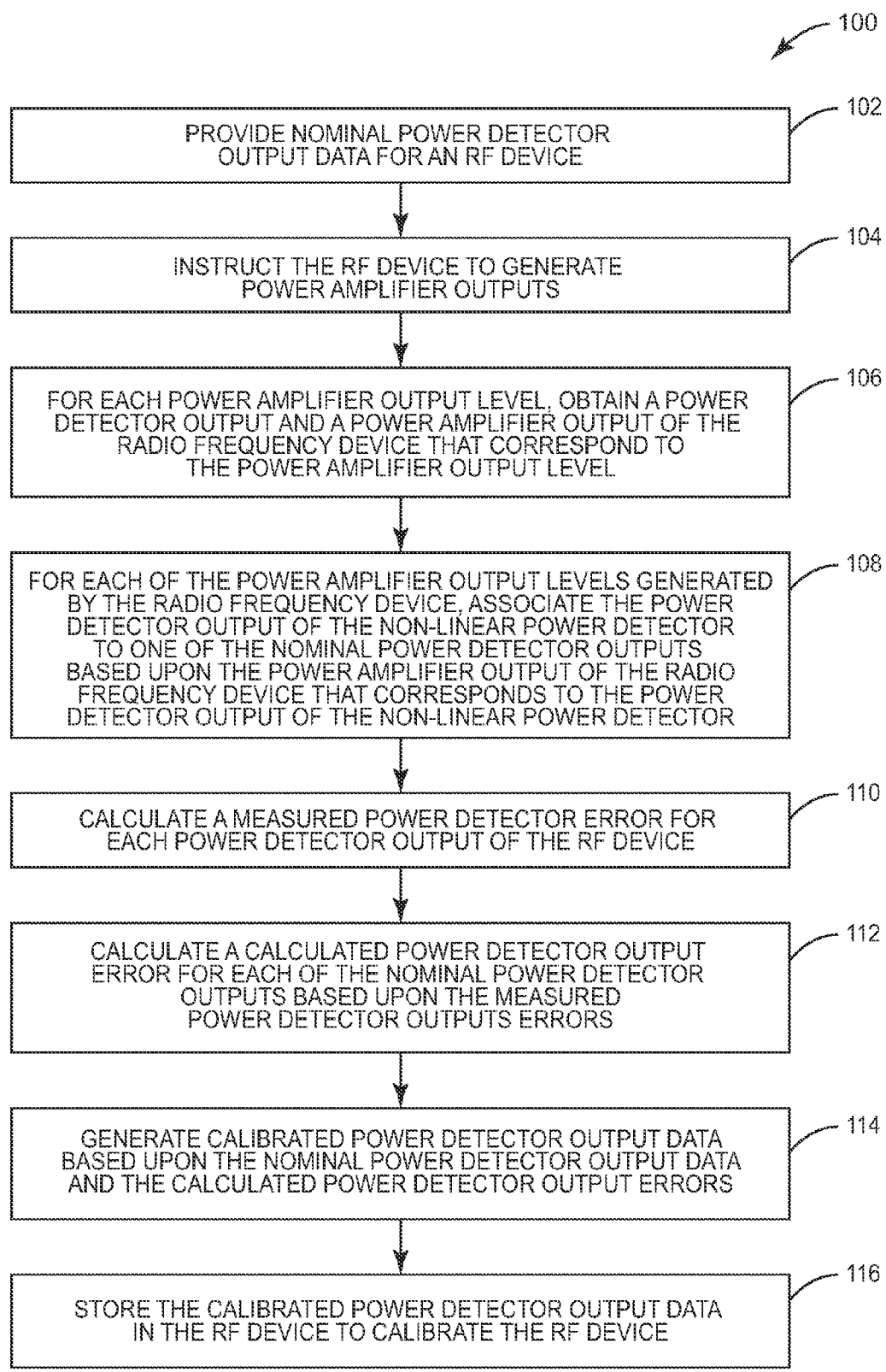
FIG. 4 depicts an example method for calibrating an RF device that uses a non-linear power detector to control the power output of an RF power amplifier.

FIG. 4 depicts an example method 100 for calibrating an RF device that uses a non-linear power detector to control the output power level of an RF power amplifier. Method 100 of FIG. 4 will be discussed with continuing reference to FIGS. 2A, 2B, and 3. A calibration system 40A, 40B, may provide nominal power detector output data for a non-linear power detector of an RF device 10A, 10B, 10C, (102). The nominal power detector output data may be stored in the calibration controller 42A, 42B, of the calibration system 40A, 40B. To begin calibrating the RF device 44A, 44B, the calibration controller 42A, 42B may instruct the RF device 44A, 44B, via the control interface 20 to generate various power amplifier output power levels, (104). For example, the calibration controller 42A, 42B, may instruct the RF device 44A, 44B, to generate an RF output, $RF_{OUT}$, at a first power amplifier output power level, $V_{OUT1}$, a second power amplifier output power level, $V_{OUT2}$, and a third power amplifier output power level, $V_{OUT3}$, as depicted in FIG. 3. The first power amplifier output power level, $V_{OUT1}$, may correspond to a low power level. The second power amplifier output power level, $V_{OUT2}$, may correspond to a medium power level. The third power amplifier output power level, $V_{OUT3}$, may correspond to a high power level. In some embodiments, the calibration controller 42A, 42B, may instruct the RF device 44A, 44B to generate an RF output, $RF_{OUT}$, at a lower power level and a high power level.

For each of the power amplifier output levels generated by the radio frequency device, the calibration controller 42A, 42B may obtain a power detector output voltage, $V_{DET}$, of the radio frequency device 44A, 44B, and a power amplifier output power level, $V_{OUT}$, for each power amplifier output level generated at the RF output, $RF_{OUT}$, of the RF device 44A, 44B, (106). For example, the calibration controller 42A may obtain the measured power detector output voltages, $V_{DET1}$, $V_{DET2}$, and $V_{DET3}$, (depicted in FIG. 3) from the voltmeter 48, where the measured power detector output voltages, $V_{DET1}$, $V_{DET2}$, and $V_{DET3}$, which correspond to the measured power amplifier output voltage levels, $V_{OUT1}$, $V_{OUT2}$, and $V_{OUT3}$, respectively. As another example, the calibration controller 42B may obtain the measured power detector output voltages, $V_{DET1}$, $V_{DET2}$, and $V_{DET3}$, from either the memory or the processor of the RF device 44B. In the case where the RF device 44A does not include an external pin or an analog-to-digital converter to provide the power detector output voltage, $V_{DET}$, the calibration controller 42A may use the value of digital $V_{RAMP}$ signal, $V_{RAMP\_D}$, used to generate the $V_{RAMP}$ signal as the measured power detector output voltages, $V_{DET1}$, $V_{DET2}$, and $V_{DET3}$, generated by the non-linear power detector of the RF device 44A. For example, the calibration controller 42A may provide a value of a target supply voltage for each of the plurality of power amplifier output levels to be generated by the power amplifier of the RF device. For example, referring to FIG. 1A, the target supply voltage may be the digital value of the digital $V_{RAMP}$ signal, $V_{RAMP\_D}$, that the processor 24 provides to the digital-to-analog converter 28 in order to generate a desired $V_{RAMP}$.

As another example, the calibration controller 42A, 42B, may obtain the power amplifier output level, $V_{OUT}$, for each power amplifier output level that the RF device, 44A, 44B, generates based upon the instructions from the calibration controller 42A, 42B, from the power meter 46. The power meter 46 may measure the power amplifier output level at the antenna port of the RF device 44A, 44B. Alternatively, the power meter 46 may measure the radiated power amplifier output level generated by the antenna of the RF device 44A, 44B.

The calibration controller 42A, 42B, may be configured to associate each measured power detector output voltage, $V_{DET1}$, $V_{DET2}$, and $V_{DET3}$, to one of the nominal power detector output voltages, $V_{NOM}$, of the nominal power detector output data based upon the respective measured power amplifier output voltage levels, $V_{OUT1}$, $V_{OUT2}$, and $V_{OUT3}$, that correspond to the measured power detector output voltage, $V_{DET1}$, $V_{DET2}$, and $V_{DET3}$, (108). For example, in the case where the measured power amplifier output voltage levels, $V_{OUT1}$, $V_{OUT2}$, and $V_{OUT3}$, provide greater resolution than the nominal power detector output data, the calibration controller 42A, 42B, may round the measured power amplifier output voltage levels, $V_{OUT1}$, $V_{OUT2}$, and $V_{OUT3}$, to have the same resolution as provided by the nominal power detector output data stored in the calibration controller 42A, 44B. After the rounding operation, the calibration controller 42A, 42B, matches each of the measured power amplifier output voltage, $V_{OUT1}$, $V_{OUT2}$, and $V_{OUT3}$, to a respective nominal power amplifier output level, $V_{OUT\_NOM1}$, $V_{OUT\_NOM2}$, and $V_{OUT\_NOM3}$, of the nominal power detector output data, as depicted in FIG. 3. As an example, depicted in FIG. 3, for the first measuring point, $MP_1$, $V_{OUT1}$ is matched to $V_{OUT\_NOM1}$. For the second measuring point, $MP_2$, $V_{OUT2}$ is matched to $V_{OUT\_NOM2}$. For the third measuring point, $MP_3$, $V_{OUT3}$ is matched to $V_{OUT\_NOM3}$. Thereafter, the measured power detector output voltages, $V_{DET1}$, $V_{DET2}$, and $V_{DET3}$, may then be compared to the nominal power detector output voltages, $V_{NOM1}$, $V_{NOM2}$, and $V_{NOM3}$, that correspond to the nominal power amplifier output power levels, $V_{OUT\_NOM1}$, $V_{OUT\_NOM2}$, and $V_{OUT\_NOM3}$, repectively.

A power detector output error, $\Delta(V_{OUT})$, for each of the measured power detector output voltages, $V_{DET1}$, $V_{DET2}$, and $V_{DET3}$, may then be calculated (110). For example, a first power detector output error, $\Delta 1$, is the difference between the first measured power detector output voltage, $V_{DET1}$, and the nominal power detector output voltage, $V_{NOM1}$. A second power detector output error, $\Delta 2$, is the difference between the second power detector output voltage, $V_{DET2}$, and the nominal power detector output voltage, $V_{NOM2}$. The third power detector output error, $\Delta 3$, is the difference between the first power detector output voltage, $V_{DET3}$, and the nominal power detector output voltage, $V_{NOM3}$.

Thereafter, a power detector error, $\Delta(V_{OUT})$, for each of the nominal power detector output voltages contained in the nominal power detector output data may be calculated based on the measured power detector errors, $\Delta 1$, $\Delta 2$, $\Delta 3$, (112). As an example, a power detector output error function, $F(V_{OUT})$, for the RF device 44A, 44B being calibrated may be determined based upon the power detector output errors, $\Delta 1$, $\Delta 2$, $\Delta 3$, and the nominal power amplifier output levels, $V_{OUT\_NOM1}$, $V_{OUT\_NOM2}$, $V_{OUT\_NOM3}$, associated with the power detector output errors, $\Delta 1$, $\Delta 2$, $\Delta 3$. The power detector output error function, $F(V_{OUT})$, may be a piece-wise linear function. As an example, the power detector output function, $F(V_{OUT})$, may characterize the power detector output errors based upon a set of linear functions, $F_1(V_{OUT})$ and $F_1(V_{OUT})$, depicted in FIG. 3, where $$F_1(V_{OUT}) = [(\Delta 2 - \Delta 1)/(V_{OUT\_NOM2} - V_{OUT\_NOM1})]^* (V_{OUT} - V_{OUT\_NOM1}) + \Delta 1, \text{ for } V_{out} \leq V_{OUT\_NOM2},$$

and $$F_2(V_{OUT}) = [(\Delta 3 - \Delta 2)/(V_{OUT\_NOM3} - V_{OUT\_NOM2})]^* (V_{out} - V_{OUT\_NOM2}) + \Delta 2, V_{out} > V_{OUT\_NOM2}.$$

In some embodiments, the power detector output error function, $F(V_{OUT})$, may be a line based upon only two measured data points. As an example, in the case where the calibration controller 42A, 42B, only instructs the RF device 44A, 44B to generate an RF output, $RF_{OUT}$, at a lower power level and a high power level, power detector output error function, $F(V_{OUT})$, may be a linear function $F(V_{OUT})'$ as follows:

$$F(V_{OUT})' = [(\Delta 3 - \Delta 1)/(V_{OUT\_NOM3} - V_{OUT\_NOM1})]^* (V_{OUT} - V_{OUT\_NOM1}) + \Delta 1.$$

Using the calculated power detector errors provided by the power detector output function, and the measured power detector errors, $\Delta 1$, $\Delta 2$, $\Delta 3$, the calibration controller 42A, 42B, may generate a calibrated power detector output data for the RF device, 44A, 44B, being calibrated, (114). The calibrated power detector output data may be generated by shifting the nominal power detector output voltages, $V_{NOM}$ ($V_{OUT}$), stored in the nominal power detector output data by an amount equal to the calculated power detector errors. The calibrated power detector output voltages, $V_{DET\_CAL}(V_{OUT})$, may be calculated as follows:

$$V_{DET\_CAL}(V_{OUT}) = V_{NOM}(V_{OUT}) + F_1(V_{OUT}), \text{ for } V_{OUT} \leq V_{OUT\_NOM2},$$

and $$V_{DET\_CAL}(V_{OUT}) = V_{NOM}(V_{OUT}) + F_2(V_{OUT}), V_{OUT} > V_{OUT\_NOM2}, \text{ and}$$

where $V_{NOM}(V_{OUT})$ represents the nominal power detector output voltages for each nominal output power level specified in the nominal power detector output data.

In some embodiments of method 100, for example where the calibration controller 42A, 42B, only instructs the RF device 44A, 44B to generate an RF output, $RF_{OUT}$, at a lower power level and a high power level, the calculated power detector output voltage, $V_{DET\_CAL}(V_{OUT})'$, may be calculated as follows:

$$V_{DET\_CAL}(V_{OUT}) = V_{NOM}(V_{OUT}) + F(V_{OUT})'.$$

The calibration controller 42A, 42B, stores the calibrated power detector output data in the memory of RF device 44A, 44B, to calibrate the RF device, 44A, 44B, (116). For example, referring to FIGS. 1A, 1B, and 1C, the calibrated power detector output data may be stored in the memory 26 associated with the processor 24 via the control interface 20. Similar to the nominal power detector output data stored in the calibration controller 42A, 42B, the calibrated power detector output data may include a calculated power detector output voltage, $V_{DET\_CAL}$, and an associated nominal power amplifier output, $V_{OUT\_NOM}$, for each of the nominal power detector outputs, $V_{NOM}$, contained in the nominal power detector output data.

Figure 5:
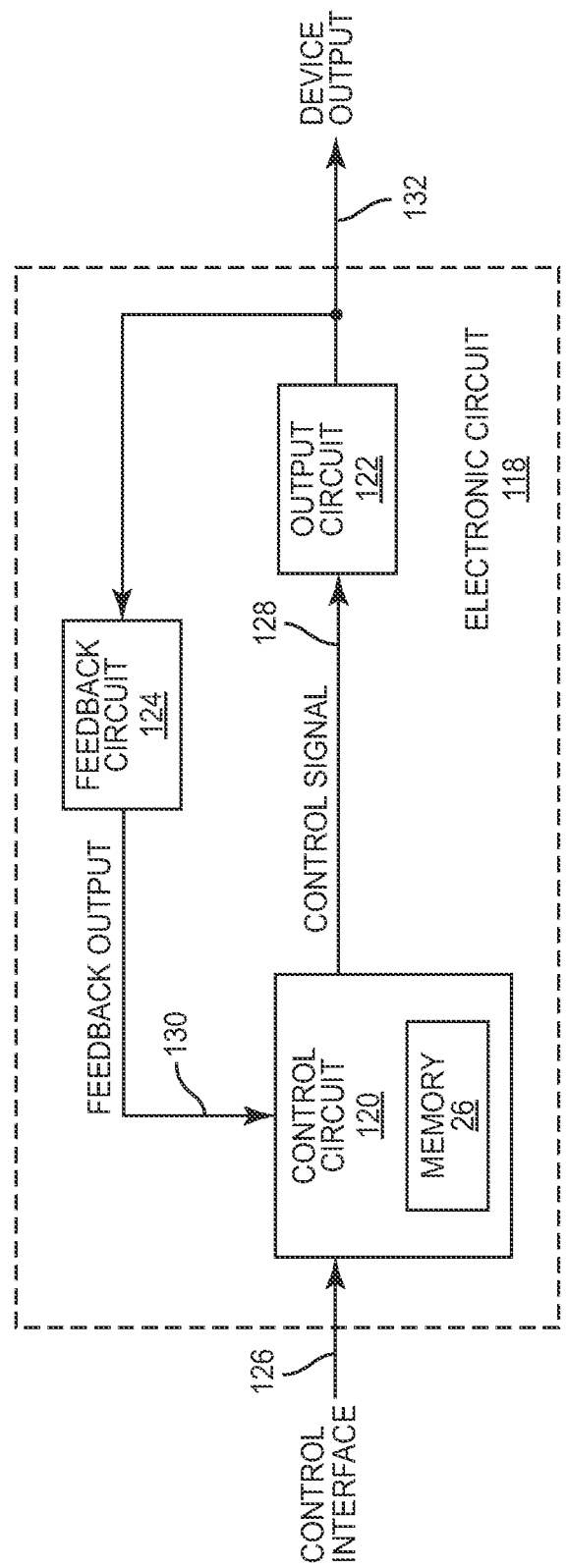
FIG. 5 depicts an embodiment of an example electronic device.

FIG. 5 depicts an example embodiment of an electronic device 118 having a control circuit 120, an output circuit 122, and a feedback circuit 124. In some embodiments, the feedback circuit 124 may be a non-linear feedback circuit. The control circuit 120 may be configured to couple to a control interface 126 by which a calibration system (not shown) may control the electronic circuit 118. The control circuit 120 may include a memory 26 in which calibrated response curve data of the feedback circuit 124 may be stored. The control circuit 120 may include a process or processor control logic, discrete or integrated control logic, registers, analog controllers, analog amplifiers, integrators, and/or other circuitry that would normally be present in a control circuit 120 of an electronic circuit known in the art.

The control circuit 120 may provide a control signal 128 to the output circuit 122. The control circuit 120 may receive a feedback output 130 from the feedback circuit 124. The control signal 128 provided by the control circuit 120 may be based, at least in part, on the feedback output 130 provided by the feedback circuit 124.

The output circuit 122 may be configured to provide an output voltage and/or current to the device output 132 of the electronic circuit 118 based at least in part on the control signal 126 received from the output circuit 122. The feedback circuit 124 may be in communication with the output circuit 122 and configured to receive an indication of the device output 132 of the electronic circuit 118 generated by the output circuit 122. The indication of the device output 132 of the electronic circuit 118 may be a voltage or a current. The indication of the device output 132 of the electronic circuit 118 may provide an indication of a power level delivered by the output circuit 122 to a load (not shown). The indication of the device output 132 of the electronic circuit 118 may be either directly or indirectly obtained from the indication of the device output 132 of the electronic circuit 118. For example, the indication of the device output of the electronic circuit 118 may be generated by a current mirror or a coupler in order to sense a current output generated by the output circuit 112.

The feedback circuit 124 generates a feedback output 130 based upon the indication of the device output 132 of the electronic circuit 118. The nominal relationship between the indication of the device output 132 of the electronic circuit 118 and the feedback output 130 generated by the feedback circuit 124 may be characterized by nominal response curve data. The nominal response curve data may include a set of data points that characterize the nominal or expected behavior of a nominal feedback circuit 124. For example, the nominal response curve data may include a nominal feedback output associated with a nominal indication of the device output 132 of the electronic circuit 118 for each data point in the set of data points that makes up the nominal response curve data. The nominal response curve data may be used by a calibration system (not shown) to generate a calibrated response curve data for each electronic circuit 118 built by in a factory. At calibration time, the calibrated response curve data may be stored in the memory of the control circuit 120 to calibrate the electronic circuit 118. During normal operation of the electronic circuit 118, the control circuit 120 may use the calibrated response curve data to generate the control signal provided to the output circuit 122.

The calibration system (not shown) for calibrating the electronic circuit 118 may include a computer or processor and measurement devices for measuring the device output of the electronic circuit 118. The calibration system (not shown) for the electronic circuit 118 may store the nominal response curve data for the electronic circuit 118 in a memory associated with the computer or processor of the calibration system (not shown).

Figure 6:
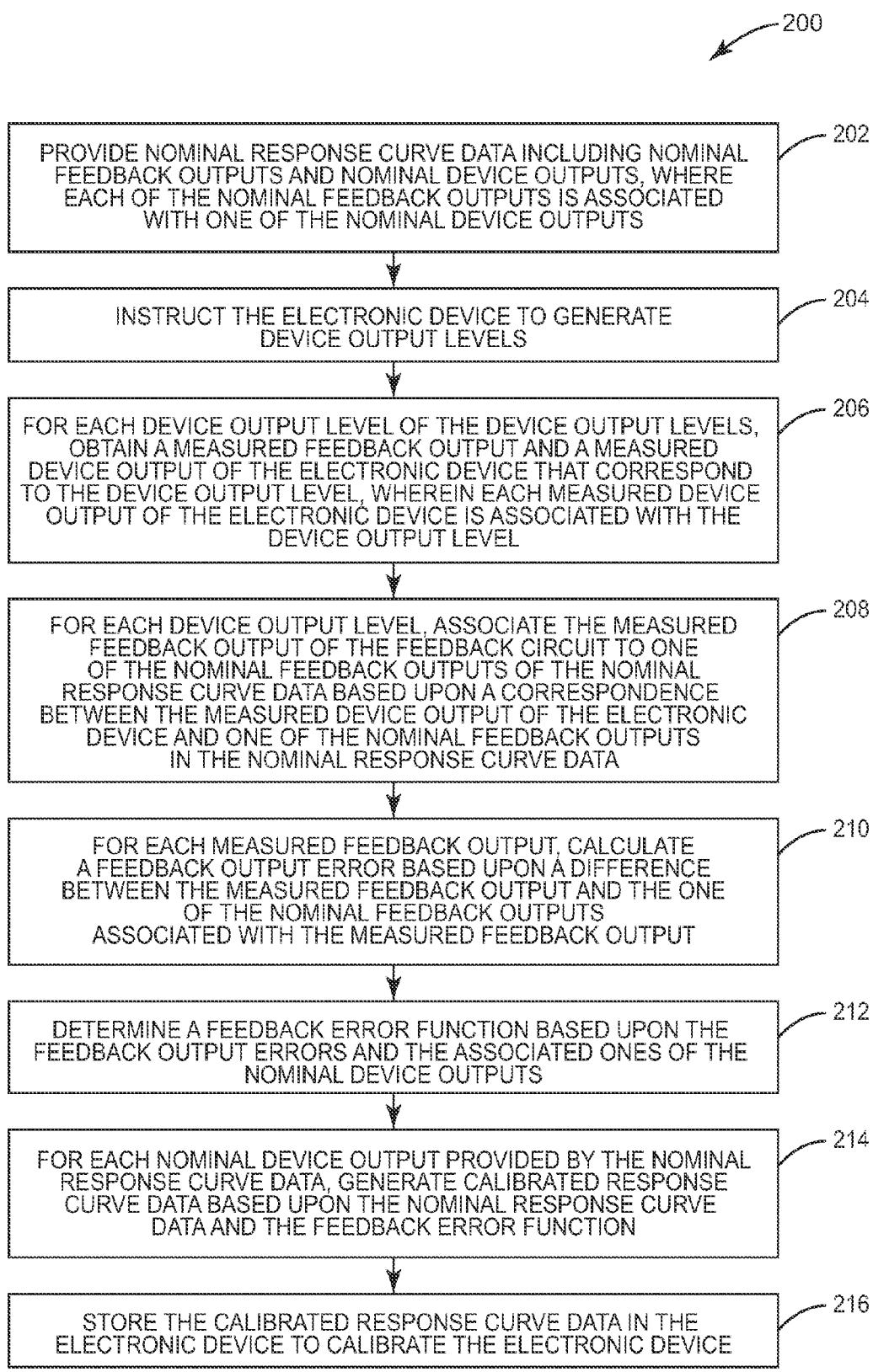
FIG. 6 depicts an example method for calibrating an electronic device that is based upon a response of the electronic device under test and a nominal response curve data set.

FIG. 6 depicts an example method 200 for calibrating an electronic device 188 that is based upon a response of the electronic device 118 under test and a nominal response curve data stored in the calibration system (not shown). The nominal response curve data may be for a non-linear feedback circuit. The example method 200 is described below with continuing reference to the electronic circuit 118 of FIG. 5.

The nominal response curve data for the calibration system (not shown) of the electronic device 118 may be provided to the calibration system (not shown), (202), and stored in the calibration system. The nominal response curve data may include nominal feedback outputs and nominal device outputs, where each of the nominal feedback outputs is associated with one of the nominal device outputs.

The calibration system (not shown) may instruct the electronic device 118 to generate several device output levels of interest during the calibration process. (204). The several device output levels may reflect low, medium, and high output levels generated by the output circuit 122 of the electronic circuit 118.

For each device output level generated by the electronic circuit 118, the calibration system may obtain a measured feedback output of the feedback circuit 124 and a measured device output of the electronic device 118, (206). The measured feedback output of the feedback circuit 124 may be either directly measured by the calibration system or obtained from the control circuit 120 via the control interface of the control circuit 120. Each measured feedback output of the feedback circuit 124 and measured device output corresponds to one of the several device output levels generated by the electronic circuit 118. In addition, each measured device output of the electronic device 118 may be associated with one of the several device output levels.

For each device output level, the calibration system associates the measured feedback output of the feedback circuit 124 to one of the nominal feedback outputs of the nominal response curve data based upon a correspondence between the measured device output of the electronic device 118 and one of the nominal feedback outputs of the nominal response curve data, (208). For example, to determine the correspondence between the measured device output of the electronic device 118 and one of the nominal feedback outputs of the nominal response curve data, the calibration system matches each measured device output to one of the nominal device outputs in the nominal response curve data.

For each measured feedback output, the calibration system (not shown) calculates a feedback output error based upon a difference between the measured feedback output and the one of the nominal feedback outputs stored in the nominal response curve data that is associated with the measured feedback output, (210). Each feedback output error may be associated with the one of the nominal device outputs based upon the association of each nominal feedback output to a nominal device output in the set of data points of the nominal response curve data.

The calibration system (not shown) for the electronic circuit 118 may determine a feedback error function for the feedback circuit 124 based upon the feedback output errors calculated by the calibration system (not shown) and the associated ones of the nominal device outputs of the nominal response curve data, (212). In some embodiment of the electronic circuit 118, the feedback error function may be a linear function. In other embodiment of the electronic circuit 118, a piecewise-linear function may be used as the feedback error function.

For each nominal device output provided by the nominal response curve data, the calibration system (not shown) may generate calibrated response curve data based upon the nominal response curve data and the feedback error function, (214). The calibrated response curve data may include a calibrated feedback output and an associated nominal device output for each nominal device output of the nominal response curve data. For example, to generate one of the calibrated feedback outputs of the calibrated response curve data, the calibration system may add the output of the feedback error function to the nominal feedback output for a nominal device output level of the nominal response curve data.

The calibration system (not shown) for the electronic circuit 118 stores the calibrated response curve data in the electronic device 118 to calibrate the electronic device 118, (216). The calibrated response curve data may be stored in the memory of the electronic device 118.

Those skilled in the art will recognize improvements and modifications to the embodiments of the present disclosure. All such improvements and modifications are considered within the scope of the concepts disclosed herein and the claims that follow.

What is claimed is:

1. A method for calibrating a radio frequency device having a non-linear power detector comprising:
providing nominal power detector output data including a plurality of nominal power detector outputs and a plurality of nominal power amplifier outputs, where each of the plurality of nominal power detector outputs is associated with one of the plurality of nominal power amplifier outputs;
instructing the radio frequency device to generate a plurality of power amplifier output levels;
for each of the plurality of power amplifier output levels generated by the radio frequency device, obtaining a power detector output of the non-linear power detector and a power amplifier output of the radio frequency device that corresponds to the power detector output of the non-linear power detector;
for each of the plurality of power amplifier output levels generated by the radio frequency device, associating the power detector output of the non-linear power detector to one of the plurality of nominal power detector outputs based upon the power amplifier output of the radio frequency device that corresponds to the power detector output of the non-linear power detector;

for each power detector output of the non-linear power detector associated with the one of the plurality of nominal power detector outputs, calculating a measured power detector output error of a plurality of measured power detector output errors based upon a difference between the power detector output and the one of the plurality of nominal power detector outputs associated with the power detector output, wherein each measured power detector output error is associated with one of the plurality of nominal power amplifier outputs;

for each of the plurality of nominal power detector outputs that is unassociated with the one of the plurality of measured power detector output errors, calculating a calculated power detector output error of a plurality of calculated power detector output errors based upon the plurality of measured power detector output errors and the plurality of nominal power amplifier outputs associated with the plurality of measured power detector output errors, wherein each calculated power detector output error is associated with one of the plurality of nominal power amplifier outputs;

generating a calibrated power detector output data based upon the nominal power detector output data and the plurality of calculated power detector output errors; and storing the calibrated power detector output data in the radio frequency device to calibrate the radio frequency device.

2. The method of claim 1 generating the calibrated power detector output data based upon the nominal power detector output data, the plurality of calculated power detector output errors, and the plurality of measured power detector output errors comprises:

for each of the calculated power detector output errors, adding the calculated power detector output error to the one of the plurality of nominal power detector outputs associated with the calculated power detector output error.

3. The method of claim 1 wherein measuring the power detector output of the radio frequency device and the power amplifier output of the radio frequency device that corresponds to the power detector output of the radio frequency device comprises:

measuring the power amplifier output of the radio frequency device at an antenna port of the radio frequency device.

4. The method of claim 1 wherein measuring the power detector output of the radio frequency device and the power amplifier output of the radio frequency device that corresponds to the power detector output of the radio frequency device comprises:

measuring a radiated power from an antenna coupled to an antenna port of the radio frequency device as the power amplifier output of the radio frequency device.

5. The method of claim 1, wherein the radio frequency device includes a control interface, wherein measuring the power detector output of the radio frequency device and the power amplifier output of the radio frequency device that corresponds to the power detector output of the radio frequency device comprises:

instructing the radio frequency device to provide the power detector output; and receiving the power detector output from the radio frequency device.

6. The method of claim 1 wherein the plurality of power amplifier output levels generated by the radio frequency device include a lower power level, a medium power level, and a high power level.

7. The method of claim 1 wherein the plurality of power amplifier output levels generated by the radio frequency device include a lower power level and a high power level.

8. The method of claim 1 wherein for each power detector output of the non-linear power detector associated with one of the plurality of nominal power detector outputs, calculating the measured power detector output error of the plurality of measured power detector output errors based upon the difference between the power detector output and the one of the plurality of nominal power detector outputs associated with the power detector output comprises:

determining a power detector output error function based upon the plurality of measured power detector output errors and the plurality of nominal power amplifier outputs associated with the plurality of measured power detector output errors that characterize the calculated power detector output error of the plurality of calculated power detector output errors; and generating the calculated power detector output error for each of the plurality of nominal power detector outputs that are unassociated with one of the plurality of measured power detector output errors based upon the power detector output error function.

9. The method of claim 8 wherein the power detector output error function is a piecewise linear function.

10. The method of claim 8 wherein instructing the radio frequency device to generate the plurality of power amplifier output levels comprises:

instructing the radio frequency device to only generate a first power amplifier output level and a second power amplifier output level.

11. The method of claim 1 wherein the nominal power detector output data for the radio frequency device is based upon an average of power detector outputs at each of the plurality of nominal power amplifier outputs for a plurality of radio frequency devices.

12. The method of claim 1 wherein the radio frequency device is a mobile terminal.

13. The method of claim 12 wherein the mobile terminal is a telephone.

14. The method of claim 1 wherein instructing the radio frequency device to generate the plurality of power amplifier output levels comprises providing a target supply voltage for each of the plurality of power amplifier output levels to be generated by a power amplifier of the radio frequency device; and wherein obtaining the power detector output of the non-linear power detector comprises using the target supply voltage as the power detector output.

15. A method for calibrating a radio frequency output of a radio frequency device having a non-linear power detector comprising:

providing nominal power detector output data including a plurality of nominal power detector outputs and a plurality of nominal power amplifier outputs, where each of the plurality of nominal power detector outputs is associated with one of the plurality of nominal power amplifier outputs;

instructing the radio frequency device to generate a plurality of power amplifier output levels;

for each power amplifier output level of the plurality of power amplifier output levels, obtaining a power detector output of the non-linear power detector and a power amplifier output of the radio frequency device that correspond to the power amplifier output level, wherein each power amplifier output of the radio frequency device is associated with the power amplifier output level;

for each of the plurality of power amplifier output levels, associating the power detector output of the non-linear power detector to one of the plurality of nominal power detector outputs of the nominal power detector output data based upon the power amplifier output of the radio frequency device that corresponds to the power detector output of the non-linear power detector;

for each power detector output of the non-linear power detector associated with one of the plurality of nominal power detector outputs, calculating a power detector output error of a plurality of power detector output errors based upon a difference between the power detector output and the one of the plurality of nominal power detector outputs associated with the power detector output, wherein each power detector output error is associated with the one of the plurality of nominal power amplifier outputs;

determining a power detector error function based upon the plurality of power detector output errors and the associated ones of the plurality of nominal power amplifier outputs;

for each of the plurality of nominal power amplifier outputs provided by the nominal power detector output data, generating calibrated power detector output data based upon the nominal power detector output data and the power detector error function; and storing the calibrated power detector output data in the radio frequency device to calibrate the radio frequency device.

16. The method of claim 15 wherein determining the power detector error function based upon the plurality of power detector output errors and the associated ones of the plurality of nominal power amplifier outputs comprises:

determining one or more linear equations to characterize the plurality of power detector output errors based upon the plurality of power detector output errors and the associated ones of the plurality of nominal power amplifier outputs; and wherein the power detector error function includes the one or more linear equations that characterize the plurality of power detector output errors.

17. The method of claim 16 wherein for each of the nominal power amplifier outputs provided by the nominal power detector output data, generating the calibrated power detector output data based upon the nominal power detector output data and the power detector error function comprises:

for each of the plurality of nominal power amplifier outputs in the nominal power detector output data:

generating a calculated power detector error based upon the one or more linear equations that characterize the plurality of power detector output errors, wherein each calculated power detector error is associated with one of the nominal power amplifier output; and adding the calculated power detector error to a nominal power detector output of the plurality of nominal power detector outputs that is associated with the one of the nominal power amplifier output.

18. The method of claim 16 wherein the plurality of power amplifier output levels generated by the radio frequency device include a lower power level and a high power level; and wherein the one or more linear equations that characterize the plurality of power detector output errors include only one linear equation.

19. The method of claim 16 wherein the plurality of power amplifier output levels generated by the radio frequency device include a lower power level, a medium power level, and a high power level; and wherein the one or more linear equations that characterize the plurality of power detector output errors include only two linear equations.

20. The method of claim 15 wherein for each power amplifier output level of the plurality of power amplifier output levels, measuring the power amplifier output of the radio frequency device that corresponds to the power amplifier output level, wherein each power amplifier output of the radio frequency device is associated with the power amplifier output level comprises:

measuring the power amplifier output of the radio frequency device at an antenna port of the radio frequency device.

21. The method of claim 15 wherein for each power amplifier output level of the plurality of power amplifier output levels, measuring the power amplifier output of the radio frequency device that corresponds to the power amplifier output level, wherein each power amplifier output of the radio frequency device is associated with the power amplifier output level comprises:

measuring a radiated power from an antenna coupled to an antenna port of the radio frequency device as the power amplifier output of the radio frequency device.

22. The method of claim 15 wherein the plurality of power amplifier output levels generated by the radio frequency device include a lower power level, a medium power level, and a high power level.

23. The method of claim 15 wherein the nominal power detector output data for the radio frequency device is based upon an average of power detector outputs at each of the plurality of nominal power amplifier outputs for a plurality of radio frequency devices.

24. The method of claim 15 wherein the radio frequency device is a mobile terminal.

25. The method of claim 24 wherein the mobile terminal is a telephone.

26. The method of claim 15 wherein instructing the radio frequency device to generate the plurality of power amplifier output levels comprises providing a target supply voltage for each of the plurality of power amplifier output levels to be generated by a power amplifier of the radio frequency device; and wherein obtaining the power detector output of the non-linear power detector comprises using the target supply voltage as the power detector output.

27. A non-transitory computer readable medium embodying a program for using nominal power detector output data of a non-linear power detector to calibrate a radio frequency device, wherein the nominal power detector output data includes a plurality of nominal power detector outputs and a plurality of nominal power amplifier outputs, wherein each of the plurality of nominal power detector outputs is associated with one of the plurality of nominal power amplifier outputs, the program comprising a plurality of computer executable instructions to calibrate a radio frequency output of the radio frequency device, wherein the plurality of computer executable instructions include instructions to:

command the radio frequency device to generate a plurality of power amplifier output levels;

obtain, for each of the plurality of power amplifier output levels generated by the radio frequency device, a power detector output of the non-linear power detector and a power amplifier output of the radio frequency device that corresponds to the power detector output of the non-linear power detector;

associate, for each of the plurality of power amplifier output levels generated by the radio frequency device, the power detector output of the non-linear power detector to one of the plurality of nominal power detector outputs based upon the power amplifier output of the radio frequency device that corresponds to the power detector output of the non-linear power detector;

calculate, for each power detector output of the non-linear power detector associated with the one of the plurality of nominal power detector outputs, a measured power detector output error of a plurality of measured power detector output errors based upon a difference between the power detector output and the one of the plurality of nominal power detector outputs associated with the power detector output, wherein each measured power detector output error is associated with one of the plurality of nominal power amplifier outputs;

calculate, for each of the plurality of nominal power detector outputs that is unassociated with the one of the plurality of measured power detector output errors, a calculated power detector output error of a plurality of calculated power detector output errors based upon the plurality of measured power detector output errors and the plurality of nominal power amplifier outputs associated with the plurality of measured power detector output errors, wherein each calculated measured power detector output error is associated with the one of the plurality of nominal power amplifier outputs;

generate calibrated power detector output data based upon the nominal power detector output data, the plurality of calculated power detector output errors, and the plurality of measured power detector output errors; and store the calibrated power detector output data in the radio frequency device to calibrate the radio frequency device.

28. A non-transitory computer readable medium embodying a program for using nominal power detector output data including a plurality of nominal power detector outputs and a plurality of nominal power amplifier outputs, where each of the plurality of nominal power detector outputs is associated with one of the plurality of nominal power amplifier outputs to calibrate a radio frequency device, comprising a plurality of computer executable instructions to calibrate a radio frequency output of the radio frequency device, wherein the plurality of computer executable instructions include instructions to:

instruct the radio frequency device to generate a plurality of power amplifier output levels;

obtain, for each power amplifier output level of the plurality of power amplifier output levels, a power detector output of a non-linear power detector and a power amplifier output of the radio frequency device that correspond to the power amplifier output level, wherein each power amplifier output of the radio frequency device is associated with the power amplifier output level;

associate, for each power amplifier output level, the power detector output of the non-linear power detector to one of the plurality of nominal power detector outputs of the nominal power detector output data based upon the power amplifier output of the radio frequency device that corresponds to the power detector output of the non-linear power detector;

calculate, for each power detector output of the non-linear power detector associated with one of the plurality of nominal power detector outputs, a power detector output error of a plurality of power detector output errors based upon a difference between the power detector output and the one of the plurality of nominal power detector outputs associated with the power detector output, wherein each power detector output error is associated with the one of the plurality of nominal power amplifier outputs;

determine a power detector error function based upon the plurality of power detector output errors and the associated ones of the plurality of nominal power amplifier outputs;

generate, for each of the plurality of nominal power amplifier outputs provided by the nominal power detector output data, calibrated power detector output data based upon the nominal power detector output data and the power detector error function; and store the calibrated power detector output data in the radio frequency device to calibrate the radio frequency device.

29. A method for calibrating an electronic device comprising:

providing nominal response curve data including a plurality of nominal feedback outputs and a plurality of nominal device outputs, where each of the plurality of nominal feedback outputs is associated with one of the plurality of nominal device outputs;

instructing the electronic device to generate a plurality of device output levels;

for each device output level of the plurality of device output levels, obtaining a measured feedback output and a measured device output of the electronic device that correspond to the device output level, wherein each measured device output of the electronic device is associated with the device output level;

for each device output level, associating the measured feedback output of a feedback circuit to one of the plurality of nominal feedback outputs of the nominal response curve data based upon a correspondence between the measured device output of the electronic device and one of the plurality of nominal feedback outputs in the nominal response curve data;

for each measured feedback output, calculating a feedback output error of a plurality of feedback output errors based upon a difference between the measured feedback output and the one of the plurality of nominal feedback outputs associated with the measured feedback output, wherein each feedback output error is associated with the one of the plurality of nominal device outputs;

determining a feedback error function based upon the plurality of feedback output errors and the associated ones of the plurality of nominal device outputs;

for each nominal device output provided by the nominal response curve data, generating calibrated response curve data based upon the nominal response curve data and the feedback error function; and storing the calibrated response curve data in the electronic device to calibrate the electronic device.

* * * * *